(12) United States Patent
Mazahreh et al.

(10) Patent No.: US 8,667,377 B1
(45) Date of Patent: Mar. 4, 2014

(54) CIRCUIT AND METHOD FOR PARALLEL DECODING

(75) Inventors: Raied N. Mazahreh, Cottonwood Heights, UT (US); Hai-Jo Tarn, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 197 days.

(21) Appl. No.: 13/228,385

(22) Filed: Sep. 8, 2011

(51) Int. Cl.
*H03M 13/00* (2006.01)

(52) U.S. Cl.
USPC ............................ 714/784; 714/782; 714/756

(58) Field of Classification Search
USPC .................. 714/784, 782, 752, 755, 756, 746
See application file for complete search history.

(56) References Cited

U.S. PATENT DOCUMENTS

| | | | | |
|---|---|---|---|---|
| 6,029,046 | A * | 2/2000 | Khan et al. ........................ | 725/31 |
| 6,658,409 | B1 * | 12/2003 | Nomura et al. ................ | 345/156 |
| 6,810,499 | B2 * | 10/2004 | Sridharan et al. ............. | 714/755 |
| 7,146,553 | B2 * | 12/2006 | Jarchi et al. .................... | 714/755 |
| 8,136,020 | B2 * | 3/2012 | Haas et al. ..................... | 714/782 |

OTHER PUBLICATIONS

U.S. Appl. No. 13/228,406, filed Sep. 8, 2011, Mazahreh, R.N. et al.
Xilinx, Inc., Forward Error Correction on ITU-G.709 Networks using Reed-Solomon Solutions, Application Note: Virtex-4 and Virtex-5 Platform FPGA Families, XAPP952 (v1.0), Dec. 5, 2007, pp. 1-14.

* cited by examiner

*Primary Examiner* — Fritz Alphonse
(74) *Attorney, Agent, or Firm* — LeRoy D. Maunu

(57) ABSTRACT

In one embodiment, a block code decoder is provided. The block code decoder includes a first decoder configured to decode Bose-Chaudhuri-Hochquenghem ("BCH") coded data packets and a second decoder configured to receive and decode Reed-Solomon ("RS") encoded data from the first decoder. The first decoder includes a first buffer configured to receive BCH encoded data and one or more BCH decoder circuits coupled to the first buffer. Each BCH decoder circuit decodes a plurality of BCH encoded bits in parallel. A second buffer is arranged to store the decoded BCH data. The second decoder includes a third buffer, arranged to receive the RS encoded data from the first decoder, one or more RS decoder circuits configured to decode a plurality of RS encoded bits in parallel, and a fourth buffer arranged to store RS payload data decoded by the RS decoder circuits.

20 Claims, 12 Drawing Sheets

CIRCUIT AND METHOD FOR PARALLEL DECODING

FIELD OF THE INVENTION

One or more embodiments generally relate to decoding data blocks.

BACKGROUND

In design of communications systems there is generally a compromise between bit error rate (BER) and transmission bit rate. Higher bit rates tend to have higher BERs. A well-known limit on capacity of a communications channel is the Shannon Limit. In practice, where forward error correction (FEC) is used, the Shannon Limit is a theoretical boundary on channel capacity for a given modulation and code rate, where the code rate is the ratio of data bits to total bits transmitted for some amount of time, such as a second. FEC coding adds redundancy to a message by encoding such a message prior to transmission. For FEC, some example error correction codes include Hamming, Bose-Chaudhuri-Hochquenghem (BCH), Reed-Solomon (RS), Viterbi, trellis, etc.

Several of these codes have been standardized in the International Telecommunication Union Telecommunication Standardization Sector (ITU-T) G.975 and G.709. For example, the standardized Reed-Solomon (255, 239) code has a net coding gain (NCG) of 6.2 dB at a 10-15 decoder output bit error rate (BER) with 6.69% redundancy ratio. However, for high-speed (10 Gb/s and beyond) communication systems, more powerful forward error correction (FEC) codes have become necessary in order to achieve greater correction capability to compensate for serious transmission quality degradation than the standard RS(255, 239) code.

More recently, Super-FEC coding schemes have been developed that utilize using a combination of two or more encoding schemes to provide greater BER correction capability and increase throughput. One example combination, specified in ITU-T G.975.1 I.4, implements a concatenation of RS and BCH encoding schemes. Due to its high performance, ITU-T G.975.1 I.4 is expected to be widely utilized in a variety of communication sectors.

G.975.1 I.4 coding consists of a 10-bit RS encoding of 16 data followed by 1-bit BCH coding. Decoding and error correction is performed by performing BCH decoding operations followed by RS decoding operations.

The G.975.1 I.4 encoding process is illustrated in FIG. 1. The data payload (ODU) includes a total of 122,368 bits. These bits are divided into sixteen groups 102 (15 groups of 7650 bits and one group of 7620 bits). The ODU groups are encoded at RS coding block 104 using 15 RS(781, 765) and 1 RS(778, 762) codes, which are shortened codes of the RS(1023, 1007) code. The RS coding produces 16 RS coded data blocks 106, which include the ODU payload and RS parity data. The ODU payload and RS parity data of the 106 form the first 124,928 bits of the G.975.1 I.4 coded output (OTU) 116.

Following RS coding, the 124,928 OTU bits 106 are partitioned and interleaved at block 108 into 64 groups of 1952 bits (110) for BCH coding. BCH coding produces interleaved BCH parity data 114. The BCH parity bits are de-interleaved at block 108 and the de-interleaved BCH parity bits of the 64 BCH groups are appended to the end of the non-interleaved 124,928 OTU data bits to form a fully encoded OTU frame with a total of 130,560 bits.

Decoding is accomplished by performing BCH decoding operations followed by RS decoding operations. However, because the final OTU frame stores the payload in a non-interleaved format, multiple bits of a BCH group cannot be processed in parallel without first buffering and interleaving the OTU data. As a result, it can be difficult to efficiently decode the BCH encoded OTU data in parallel while achieving a high throughput.

One or more embodiments may address one or more of the above issues.

SUMMARY

In one embodiment, a block code decoder is provided. The block code decoder includes a first decoder configured to decode BCH coded data packets. The first decoder includes a first memory buffer configured and arranged to receive BCH encoded data and one or more BCH decoder circuits coupled to the first memory buffer. Each of the BCH decoder circuits is configured to decode a plurality of BCH encoded bits in parallel. A second memory buffer is coupled to the BCH decoder circuits for storage of decoded BCH data. The decoded BCH data includes RS encoded data. The block code decoder includes a second decoder configured to decode RS encoded data. The second decoder includes a third memory buffer coupled to the second memory buffer, and the second decoder is configured to receive the Reed-Solomon (RS) encoded data from the first decoder. The second decoder includes one or more RS decoder circuits coupled to the third memory buffer. Each RS decoder circuit is configured to decode a plurality of RS encoded bits in parallel. A fourth memory buffer is coupled to the one or more RS decoder circuits for storage of decoded RS payload data.

In another embodiment a method of decoding for forward error correction is provided. BCH coded data that includes an interleaved plurality of separately encoded BCH data groups is received. The BCH encoded data is rearranged and stored in a first memory buffer such that stored bits of each BCH data group may be respectively read from the first memory buffer in parallel. The BCH encoded data is decoded using one or more BCH decoder circuits coupled to the first memory buffer. Each BCH decoder circuit is configured to decode a plurality of BCH encoded bits of the same BCH data group in parallel. The decoded BCH data is stored in a second memory buffer in a manner that decoded bits of the plurality of BCH encoded bits of the same BCH data group are written to the second memory buffer in parallel.

Other embodiments will be recognized from consideration of the Detailed Description and Claims, which follow

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

One or more embodiments present methods and systems for parallel decoding of forward error correction coded data. For ease of description, the embodiments and examples are primarily described with reference to G.975.1 I.4 forward error correction decoding. However, the embodiments are not necessarily so limited and may be applicable to other types of error correction coding implementations using a number of combinations of various error correction coding schemes as well.

As discussed above, G.975.1 I.4 decoding includes BCH decoding operations followed by RS decoding operations. However, because the final OTU frame stores the payload in a non-interleaved format, multiple bits of a BCH data group cannot be processed in parallel without first buffering and interleaving the OTU data. As a result, it can be difficult to efficiently decode the BCH encoded OTU data in parallel while achieving a high throughput.

For example, in one possible decoding implementation, the entire OTU block can be buffered prior to BCH decoding. This allows a decoder to access and decode multiple bits of one of the BCH groups in parallel. However, buffering the entire OTU block imposes a large RAM requirement and exhibits a large latency due to buffering time before decoding can begin.

Another possible implementation may implement a number of parallel 1-bit BCH decoders followed by a number of parallel RS decoders. For example, 32 BCH decoders may each decode 2 of the 64 BCH channels, one bit at a time, in a time interleaved fashion. Because each BCH decoder only operates on one bit, decoding can be performed as data is received. However, each of the small BCH decoders requires access to a separate look up table, which also necessitates a large amount of RAM.

One or more embodiments provide a circuit for G.975.1 I.4 decoding that rearranges data as it is received and buffered so that multiple bits can be accessed by a BCH decoder for parallel decoding of a BCH data group. The data rearrangement allows parallel decoding operations to begin prior to receiving the entire G.975.1 I.4 data packet and reduces the amount of RAM required to implement a memory buffer used by the decoders.

Figure 1:
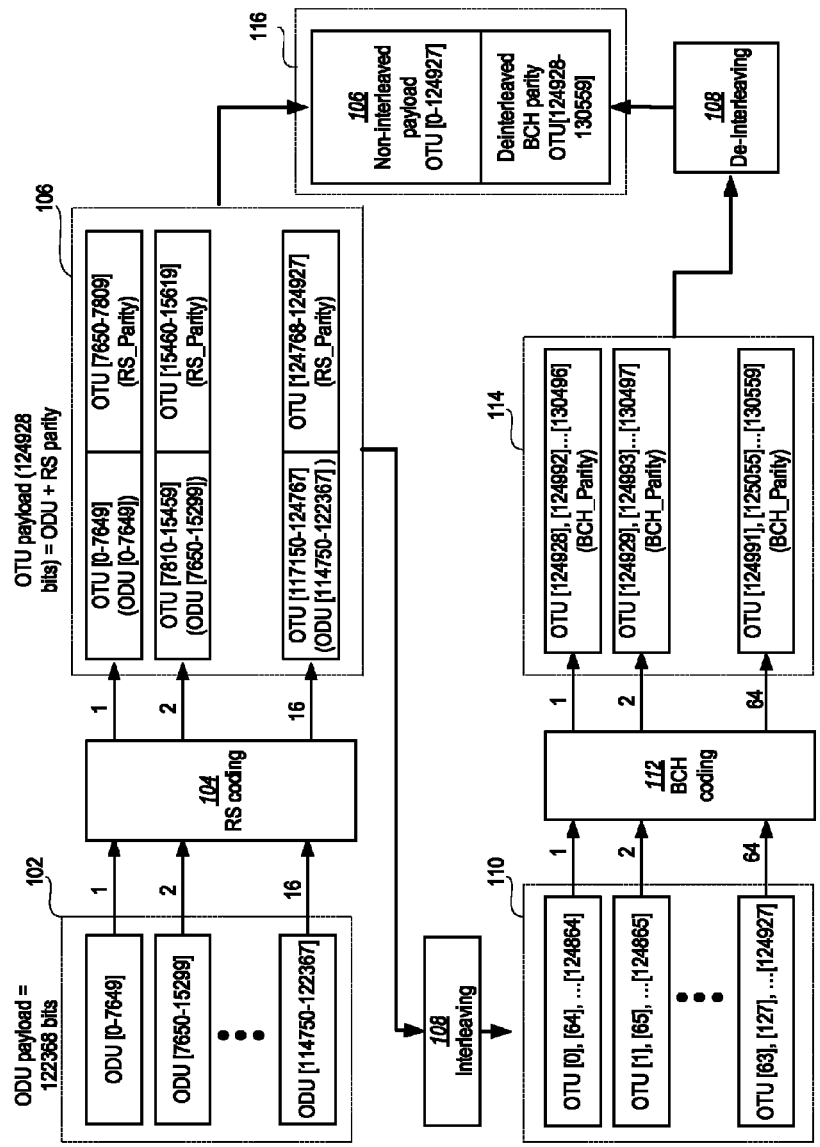
FIG. 1 illustrates an example G.975.1 I.4 coding process.
Figure 2:
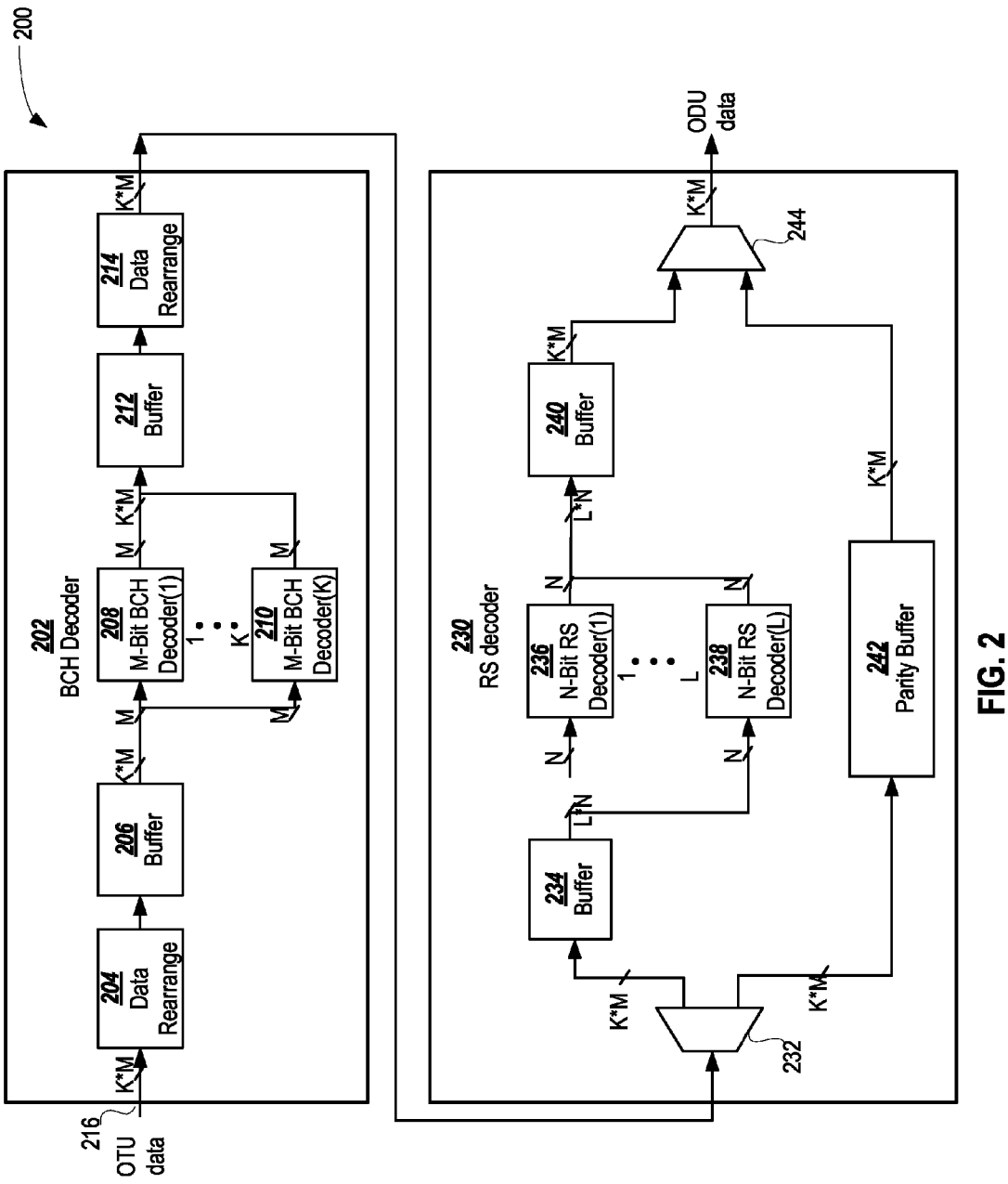
FIG. 2 shows a circuit diagram of a decoder circuit that may be configured to implement block decoding at a variety of data rates.

FIG. 2 shows a circuit diagram of a decoder circuit that may be configured to implement block decoding for a variety of data rates in accordance with one or more embodiments. The decoder 200 includes a BCH decoder 202 followed by an RS decoder 230. The BCH decoder 202 is configured to receive and process OTU data received on bus 216. The received data is rearranged by data rearrange circuit 204 and stored in memory buffer 206. As discussed above, G.975.1 I.4 data packets are encoded in 64 BCH data groups. The rearrangement of received data allows multiple bits of the same BCH data group to be accessed for parallel decoding. Rearrangement and buffering are described in more detail with reference to FIG. 3 below.

The BCH decoder 202 includes one or more M-bit BCH decoder circuits 208 and 210. Each BCH decoder is configured to receive and decode M data bits of the same BCH data group from the memory buffer 206 in each cycle. Decoded BCH data is stored in a second memory buffer 212. The BCH decoder also includes a second rearrangement circuit 214 to place the decoded data back into the correct format for RS decoding.

The RS decoder 230 is configured to receive RS-encoded data received from the BCH decoder 202. The RS decoder 230 includes a demultiplexer circuit 232 that is configured to store RS-encoded data in buffer 234 and store BCH parity data in buffer 242. The RS decoder 230 includes one or more N-bit RS decoders circuits 236 and 238 configured to receive and decode RS coded data from the buffer 234. Decoded data is stored in a second buffer 240. Multiplexor 244 recombines and outputs the decoded data stored in buffer 240 and parity data stored in buffer 242, which can be used for error correction of the decoded data (not shown).

The BCH decoder 202 may be implemented using a number of M-bit BCH decoders 208 and 210 that depends on the parallel decoding bit width of the decoders 208 and 210 used to implement the BCH decoder 202 and the data rate of the bus 216. In general, the BCH decoder 202 will include K M-bit BCH decoders, where K=bus width/M. Because 64 BCH data groups must be decoded, each M-bit BCH decoder is configured to decode 64/K BCH data groups in a time interleaved fashion. For example, if a 128-bit bus is implemented, and each BCH decoder 208 and 210 is configured to process 32 bits in parallel, the BCH decoder 202 would include 4 32-bit BCH decoders (i.e. 128 bit bus/32 bit decoders) and each 32-bit BCH decoder would be configured to process 16 BCH data groups in a time interleaved fashion (i.e., 64 BCH groups/4 decoders). Each cycle, each 32-bit BCH decoder would decode 32-bits of a different BCH data group of 16 BCH data groups assigned to the decoder.

Similarly, the RS decoder 230 may be implemented using a number of N-bit RS decoders 236 and 238 that depends on the parallel decoding bit width of decoders 236 and 238 and the width of the bus 216. In general, the RS decoder 230 will include L N-bit RS decoders, where L=bus width (K*M)/N. Because RS coded data is non-interleaved, the 16 RS data groups may be processed sequentially as they are received by the RS decoder 230. Therefore, no time interleaving is required.

Figure 3:
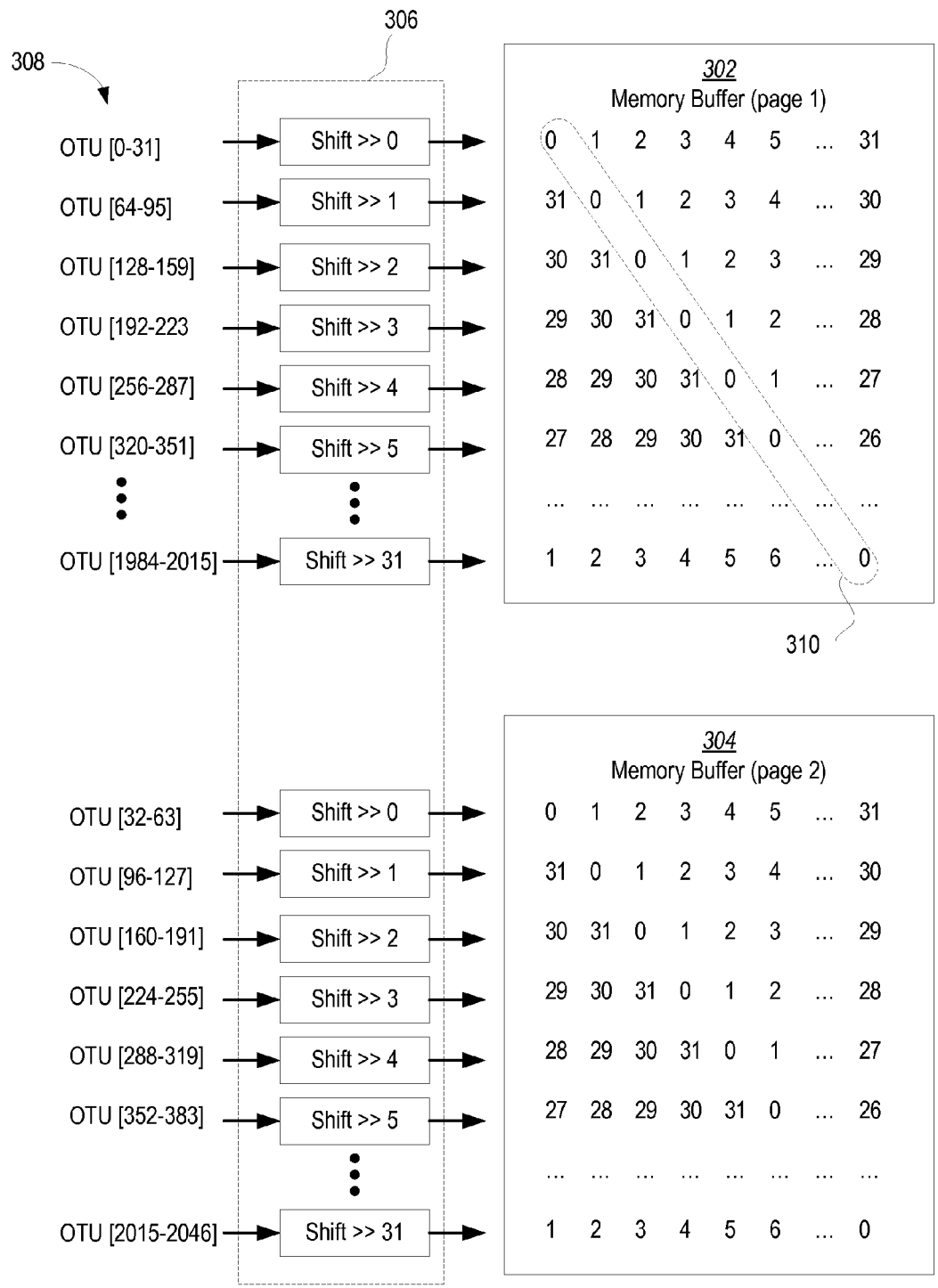
FIG. 3 shows a rearrangement of data performed in one or more embodiments to enable multiple bits of BCH data groups to be buffered for parallel processing by a decoding circuit.

FIG. 3 illustrates rearrangement and buffering of data that may be performed by rearrangement circuit 204 and buffer 206 to enable multiple bits of BCH data groups to be buffered for parallel processing by a decoding circuit. Memory cells are typically arranged in a matrix or rows and columns in which only one element of a row can be accessed at a time. Likewise only one element of a column can be accessed at a time. One or more embodiments rearrange and store data in the data buffer 206 such that buffered bits of the same BCH data group can be accessed simultaneously. This is done by arranging incoming data so that buffered bits of the same BCH data group are each stored in different respective columns and rows of the memory buffer.

As illustrated in FIG. 3, some embodiments implement the memory buffer 206 using two pages 302 and 304 that can be addressed separately. By alternating read/write operations between pages 302 and 304, memory access time can be reduced. In this example, every 32 bits of incoming OTU data 308 are stored in a row of a memory buffer which alternates between memory buffer 302 and memory buffer 304 as shown. As described above, G.975.1 I.4 coded data (OTU) is received by the decoder in a non-interleaved format. Because BCH encoding interleaves data over 64 BCH data groups, every $64^{th}$ bit received should correspond to the same BCH data group. Therefore, the first bit of every other 32-bit segment should correspond to the same BCH group (e.g., OTU [0], [64], [128] . . . ). Therefore, if the 32-bit segments were written directly to respective rows of the memories 302 and 304, the bits stored in any given column of memory buffer 302 would correspond to the same BCH data group. Likewise, bits stored in any given column of memory buffer 304 would correspond to the same BCH data group. In one implementation, the data to be stored in each row is rotated with shift circuits 306 so that the data to be stored in each row p is shifted one more column than the previous row p-1. By shifting the data in this manner, bits belonging to the same BCH data group are each stored in a different column and row as shown by 310 and may be read simultaneously.

Referring back to FIG. 2, rearrangement circuit 204 and memory buffer 206 may be implemented to perform the rearrangement and storage described in FIG. 3. Buffer 212 and rearrangement circuit 214 may be implemented in a similar fashion, except each set of data bits is simultaneously written to respective rows and columns as shown by 310. When buffer 212 is full, data from the rows are read out and shifted left by data rearrange circuit 214.

The size of the buffers 302 and 304 needed to implement the rearrangement and buffering shown in FIG. 3 depends on the number and bit-size of decoders implemented by the BCH decoder 202. In general, a memory size of (2M/K) bits×(K*M) bits is sufficient to implement memory buffer 206. In some embodiments, double buffering may be employed so incoming data can be buffered and arranged in one memory, while previously arranged and stored bits are read and decoded. In such implementations a memory size of (4M/K) bits×(K*M) bits may be sufficient to implement the rearrangement and buffering described above with double buffering.

In order to provide decoding for different communication data rates, the decoder circuit shown in FIG. 2 may easily be configured with an appropriate number of BCH and RS decoders to meet the required throughput. It is recognized that the BCH and RS decoders 202 and 230 of FIG. 2 could each be implemented with a single decoder capable of decoding an appropriate number of bits in parallel for a specified data rate. For example, the BCH decoder 202 could be implemented with a single 32-bit decoder 208 for 10 Gbps communication and with a single 128-bit decoder for 40 Gbps communication. However, such an architecture would require a different decoder to be designed for each data rate to be implemented. The architecture shown in FIG. 2 may be configured for different data rates by adjusting the number of decoders 208, 210, 236, and 238 and the sizes of the buffers 206, 212, 234, and 240 without substantial redesign. Accordingly, a decoder design may be reused and incorporated into G.975.1 I.4 decoders configured for various data rates. As a result, development time and expense can be reduced.

Figure 4:
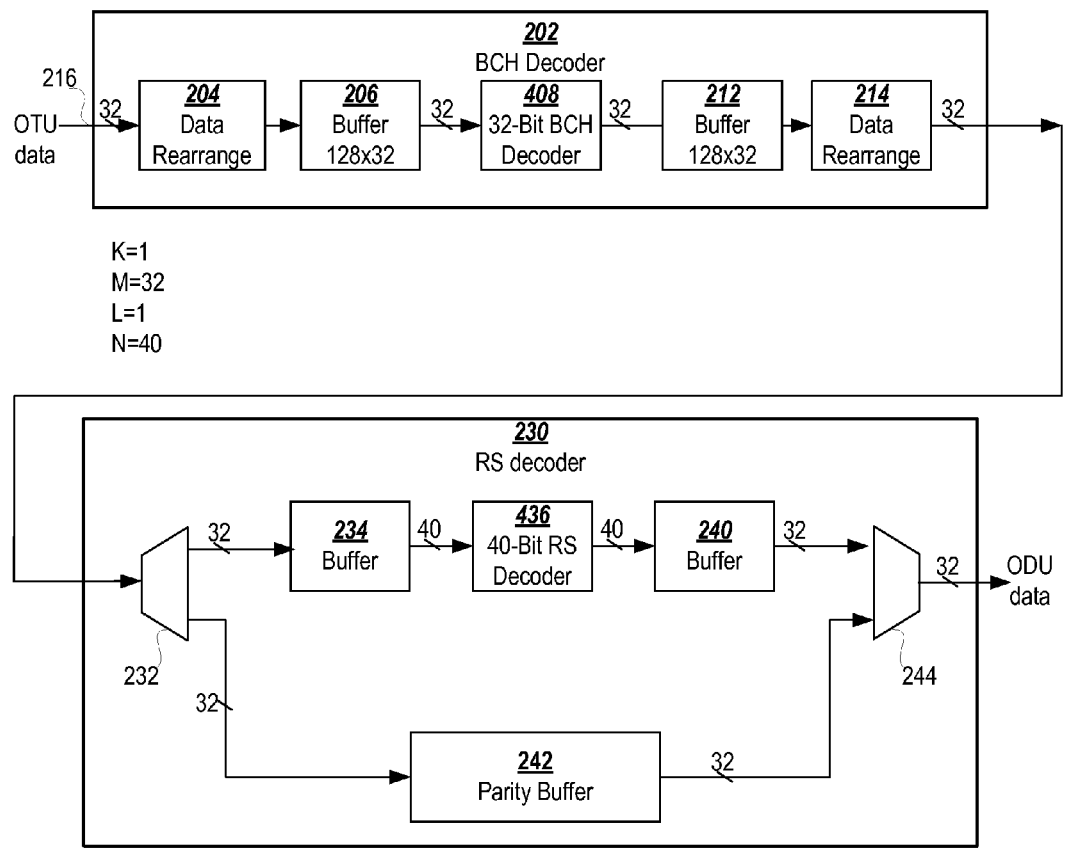
FIG. 4 shows a 10 Gbps implementation of the decoder circuit shown in FIG. 2.
Figure 5:
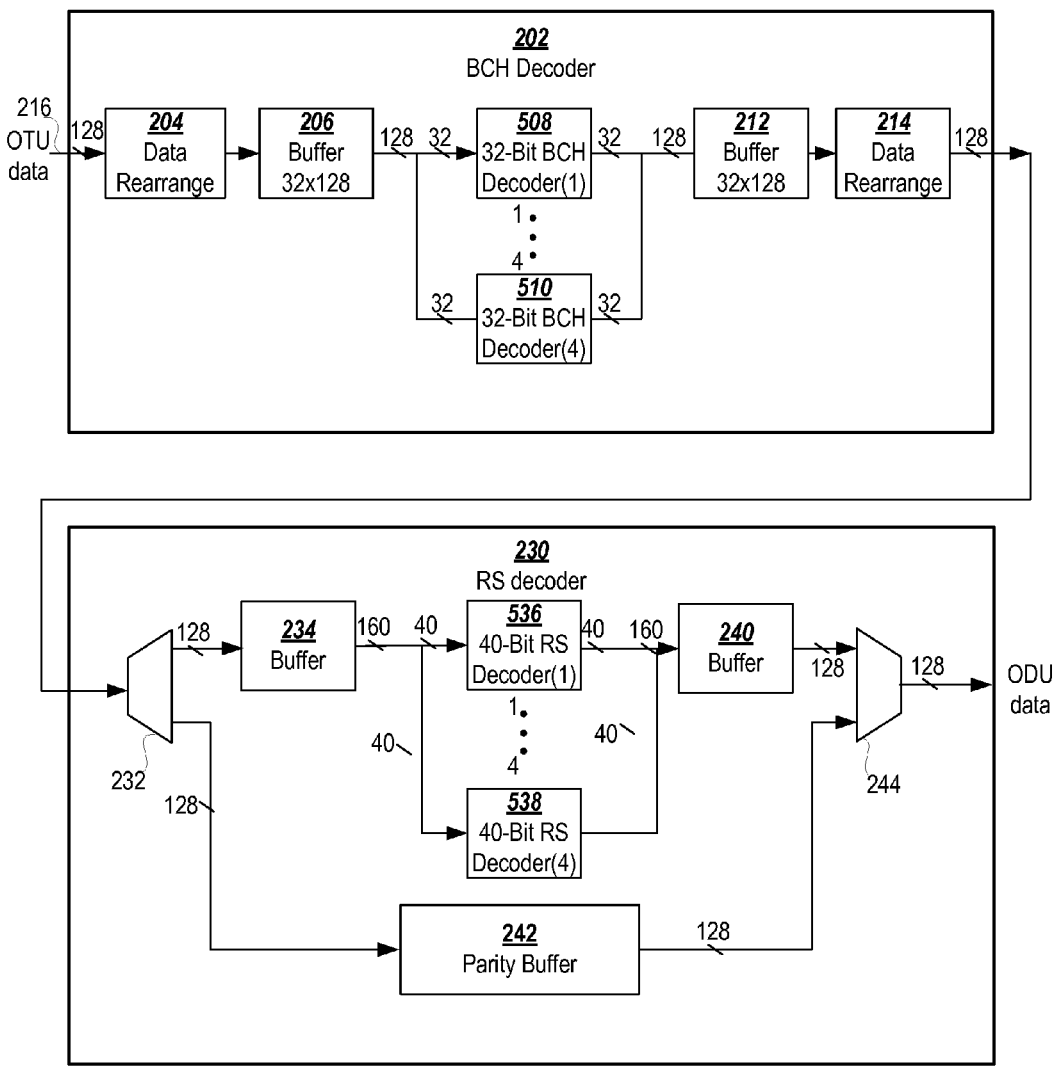
FIG. 5 shows a 40 Gbps implementation of the decoder circuit shown in FIG. 2.
Figure 6:
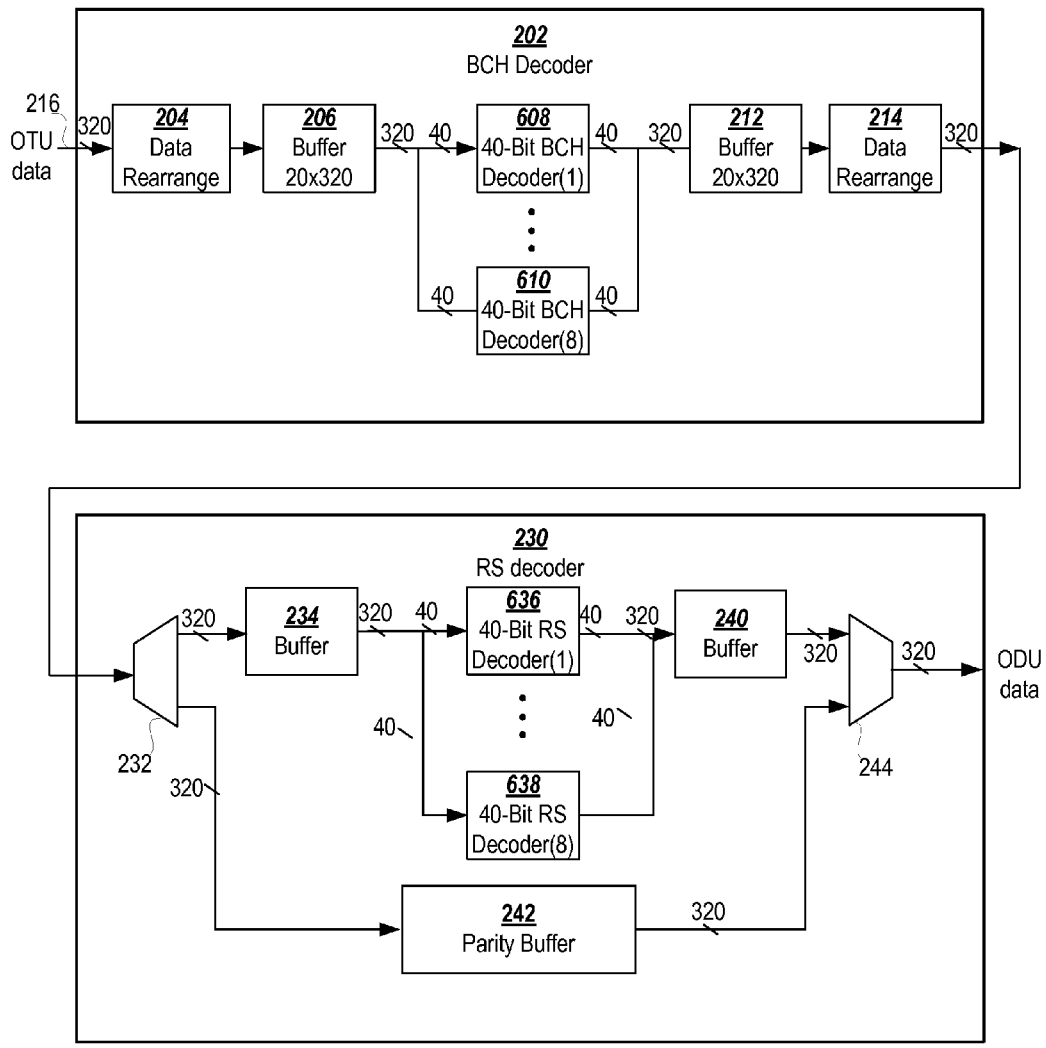
FIG. 6 shows a 100 Gbps implementation of the decoder circuit shown in FIG. 2.

FIGS. 4, 5, and 6 show configurations of the circuit shown in FIG. 2 for 10, 40, and 100 Gbps implementations and illustrate reuse of a 32-bit BCH decoder (M=32), and 40-bit RS decoder (N=40) designs.

FIG. 4 shows a 10 Gbps implementation of the decoder circuit shown in FIG. 2 using a 32-bit BCH decoder(s) (M=32), and a 40-bit RS decoder(s) (N=40). In this example implementation, the 10 Gpbs decoder receives G.975.1 I.4 coded data on a 32-bit wide bus. The BCH decoder 202 includes one 32-bit BCH decoder 408 (i.e., K=32/M=1) which is configured to decode 64 BCH channels (i.e., 64/K) in a time interleaved manner. Buffers 206 and 212 are each implemented with double buffering as described above and are configured to store a maximum of 128×32 bits (i.e., 4M/K bits×K*M bits).

Using a 40-bit RS decoder (N=40), L*N must be greater than or equal to K*M. In this case, one 40-bit RS decoder 436 is sufficient to decode 32-bit wide data received from the BCH decoder (i.e., L=1). Buffers 234 and 240 are each implemented to buffer 40 bits (i.e., L*N=40).

FIG. 5 shows a 40 Gbps implementation of the decoder circuit shown in FIG. 2 using 32-bit BCH decoders (M=32), and 40-bit RS decoders (N=40). In this example implementation, the 40 Gpbs decoder receives G.975.1 I.4 coded data on a 128-bit wide bus. The BCH decoder 202 includes four 32-bit BCH decoders 508-510 (i.e., K=128/32=4), which are each configured to decode 16 BCH channels (i.e., 64/K) in a time interleaved manner. Buffers 206 and 212 are each implemented with double buffering as described above and are configured to store a maximum of 32×128 bits (i.e., 4M/K bits×K*M bits=4*32/4×4*32).

As described above, L is selected so L*N is greater than or equal to K*M. In this case, four 40-bit RS decoders 536-538 are sufficient to decode 128-bit wide data received from the BCH decoder (i.e., L=4). Buffers 234 and 240 are each implemented to buffer 128 bits (i.e. L*N=128).

A 100 Gbps may be implemented using 32-bit BCH decoders (M=32), and 40-bit RS decoders (N=40) in a similar manner. For 100 Gbps implementations, data is received on a 320-bit wide bus. The 320 bits may be processed in parallel using ten 32-bit processors in the manner described above. However, the 64 BCH data groups cannot be evenly divided across the 10 processors. In such an implementation, each BCH decoder can be configured to process 7 BCH data groups in a time interleaved fashion with one or more of the BCH decoders remaining idle when no data is available.

The BCH decoder size may be adjusted to avoid idle processing time in the 100 Gbps decoder. For example, FIG. 6 shows an alternative implementation of the 100 Gbps decoder circuit shown in FIG. 2 using 40-bit BCH decoders (M=40) and 40-bit RS decoders (N=40).

In this example implementation, the 100 Gpbs decoder receives G.975.1 I.4 coded data on a 320 bit wide bus. The BCH decoder 202 includes eight 40-bit BCH decoders 608-610 (i.e., K=320/40=8), each of which is configured to decode 8 BCH channels (i.e., 64/8) in a time interleaved manner. Buffers 206 and 212 are each implemented with double buffering as described above and are configured to store a maximum of 20×320 bits (i.e., 4M/K bits×K*M bits=4*40/8×8*40).

As described above, L is selected so L*N is greater than or equal to K*M. In this case, eight 40-bit RS decoders 636-638 are sufficient to decode 320 bit wide data received from the BCH decoder (i.e. L=8). Buffers 234 and 240 are each implemented to buffer 320 bits (i.e. L*N=320).

Figure 7:
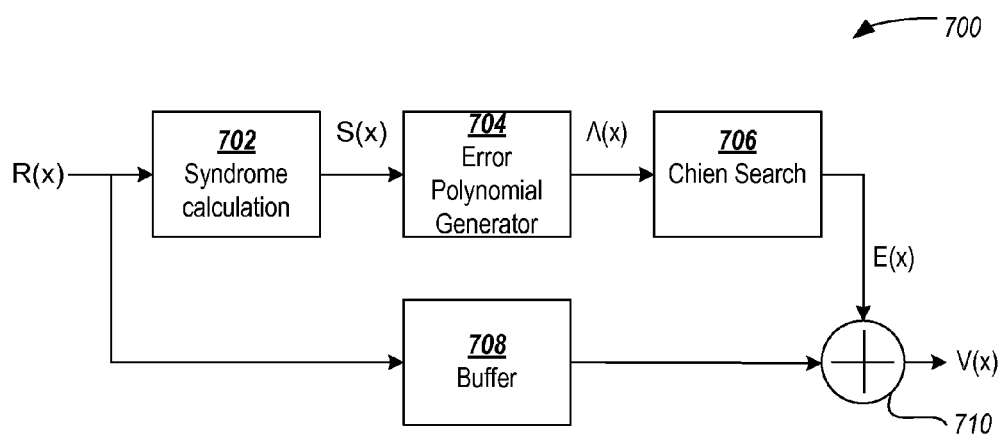
FIG. 7 shows a decoder circuit in accordance with one or more embodiments.

FIG. 7 shows a decoder circuit in accordance with one or more embodiments. The decoder 700 may, for example, be used to implement one or more of the BCH decoders 208-210 or RS decoders 236-238 shown in FIG. 2. The decoder circuit includes a syndrome calculation circuit 702, an error polynomial generator 704, a Chien search circuit 706, a memory buffer 708, and a summation circuit 710.

The syndrome calculation circuit 702 evaluates a received polynomial R(x) for a number of roots of a generator polynomial G(x) to generate a syndrome polynomial S(x). The syndrome is defined as $S_i=R'(\alpha')$, where R'(x) is the remainder R(x) mod G(x). If the received polynomial R(x) is a valid codeword, the remainder R'(x) and the syndrome S(x) are equal to 0. Otherwise, if the received polynomial contains an error, the remainder R'(x) and the syndrome S(x) will be a non zero value.

The error polynomial generator 704 receives the syndrome value and determines an error location polynomial, $\Lambda(x)$, that may be used to determine the location of the error. For an RS decoder, the error polynomial generator 704 also determines an error value polynomial as well. The Chien search circuit 706 receives and evaluates the error location and/or error value polynomial(s) to generate an error polynomial E(x) indicating the location and/or value of the error in the received polynomial. The error polynomial E(x) may then be removed from the received polynomial R(x) that is buffered in memory buffer 708, to produce a valid codeword V(x).

Figure 8:
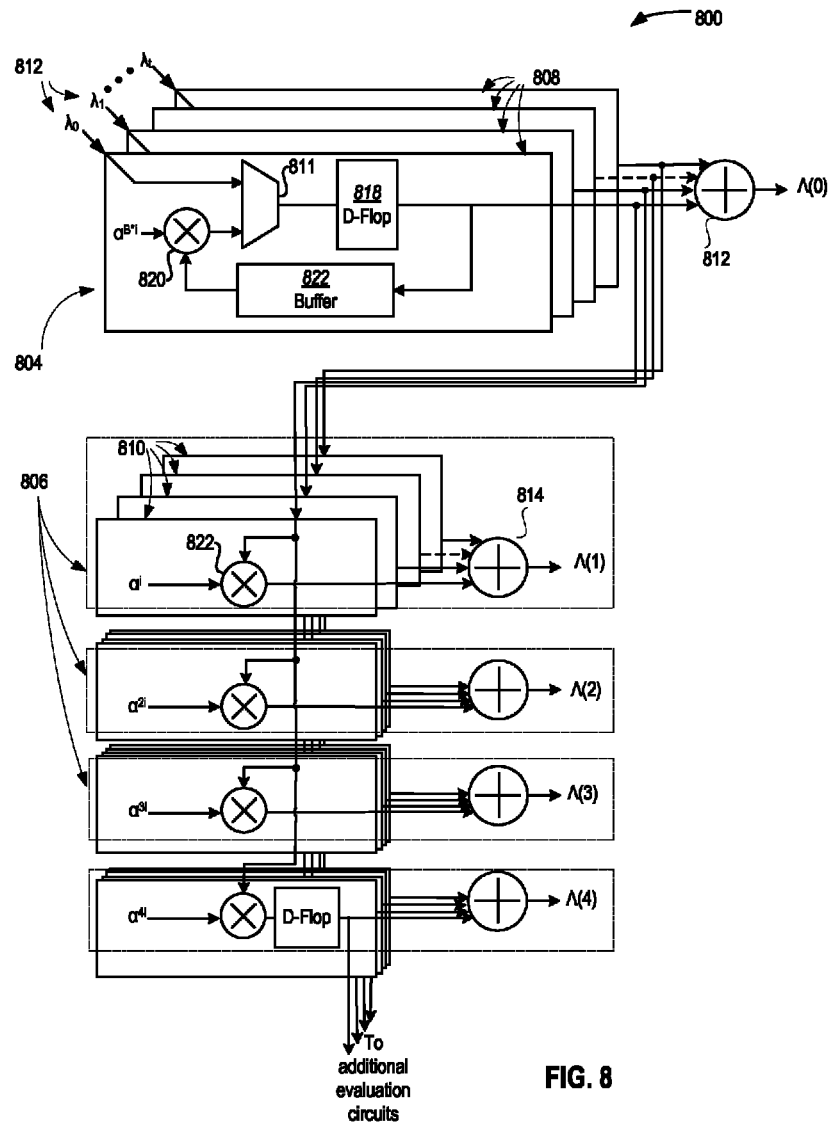
FIG. 8 shows a parallel Chien search circuit according to one embodiment.

FIG. 8 shows a parallel Chien search circuit according to one embodiment. The Chien search circuit 800 may, for example, be used to implement Chien search circuit 706 shown in FIG. 7. The Chien search circuit 800 includes a plurality of evaluation circuits including an evaluation circuit of a first type 804 and one or more evaluation circuits of a second type 806. Each of the evaluation circuits 804 and 806 is configured and arranged to sequentially evaluate a respective subset of possible roots a' of an error location polynomial ($\Lambda(x)$).

Each of the evaluation circuits 804 and 806 includes a respective plurality of sub-circuits 808 and 810. For each of the evaluation circuits, the corresponding plurality of sub-circuits includes a respective sub-circuit for each of a plurality of coefficients $\lambda_i$ 812 ($0 \leq i \leq T$) of the error location polynomial $\Lambda(x)$ having T+1 coefficients. Each sub-circuit is configured and arranged to calculate one term of the error location polynomial for each possible root in the respective subset of possible roots $\alpha^i$.

In each cycle, a respective summation circuit 812/814 of each evaluation circuit 804/806 sums terms generated by the corresponding sub-circuits to produce an error location polynomial E(x) that is evaluated for a particular root. Assuming that the circuit 800 includes B-1 evaluation circuits 806 of the second type, the evaluation circuit 804 of the first type is configured to sequentially evaluate every Bth possible root. In this example, the implementation of each sub-circuit 808 of the evaluation circuit 804 includes a multiplexor 811 configured to select and output the corresponding polynomial coefficient for storage in D-Flop 818. Subsequently, the stored polynomial coefficient is read from D-flop 818, and multiplier circuit 820 multiplies the polynomial coefficient by $\alpha^{B*i}$ to evaluate the next Bth possible root.

For each sub-circuit $\lambda_i$ of each of evaluation circuit 806$_C$ ($1 \leq C < B$) of the B-1 evaluation circuits 806 of the second type, the subcircuit is configured to multiply outputs of sub-circuit $\lambda_i$ of the evaluation circuit 804 by a respective multiple of $\alpha^{C*i}$ to evaluate a respective possible root. For example, an evaluation circuit 806 configured to multiply the sub-circuit outputs of the evaluation circuit 804 by $\alpha^i$ will evaluate the possible roots following every Bth possible root evaluated by evaluation circuit 804. Likewise, multiplying the sub-circuit outputs of the evaluation circuit 804 by $\alpha^{2i}$ will evaluate the possible roots located two roots after every Bth possible root.

The Chien search circuit may include a comparison circuit (not shown) configured to determine from the sum of the terms, whether or not each root of each respective subset of possible roots is a root of the error location polynomial.

As described above, G.975.1 I.4 decoding includes BCH decoding of 64 separate BCH data groups. In one or more embodiments, the Chien search circuit 800 is configured to evaluate possible roots of polynomials of a plurality of BCH data groups in a time division multiplexed manner. In such embodiments, each sub-circuit of the evaluation circuit 804 of the first type includes a respective buffer 822 to store an output value corresponding to one of the BCH data groups, while processing polynomials of other BCH data groups. The buffer size is equal to the number of BCH data groups that are processed in a time interleaved manner. For example, in a parallel Chien decoder configured for G.975.1 I.4, each buffer 822 would be configured to buffer 64 values corresponding to the 64 BCH data groups implemented by G.975.1 I.4.

The evaluation circuits 804 and 806 operate in parallel to evaluate the error location polynomial for different roots each cycle. In the example shown in FIG. 8, five possible roots are evaluated in parallel each cycle. However, the Chien search circuit 800 may be configured to evaluate any number of roots each cycle by adding additional evaluation circuits of the second type 806 to the output of the last evaluation circuit 806 shown in FIG. 8.

Figure 9:
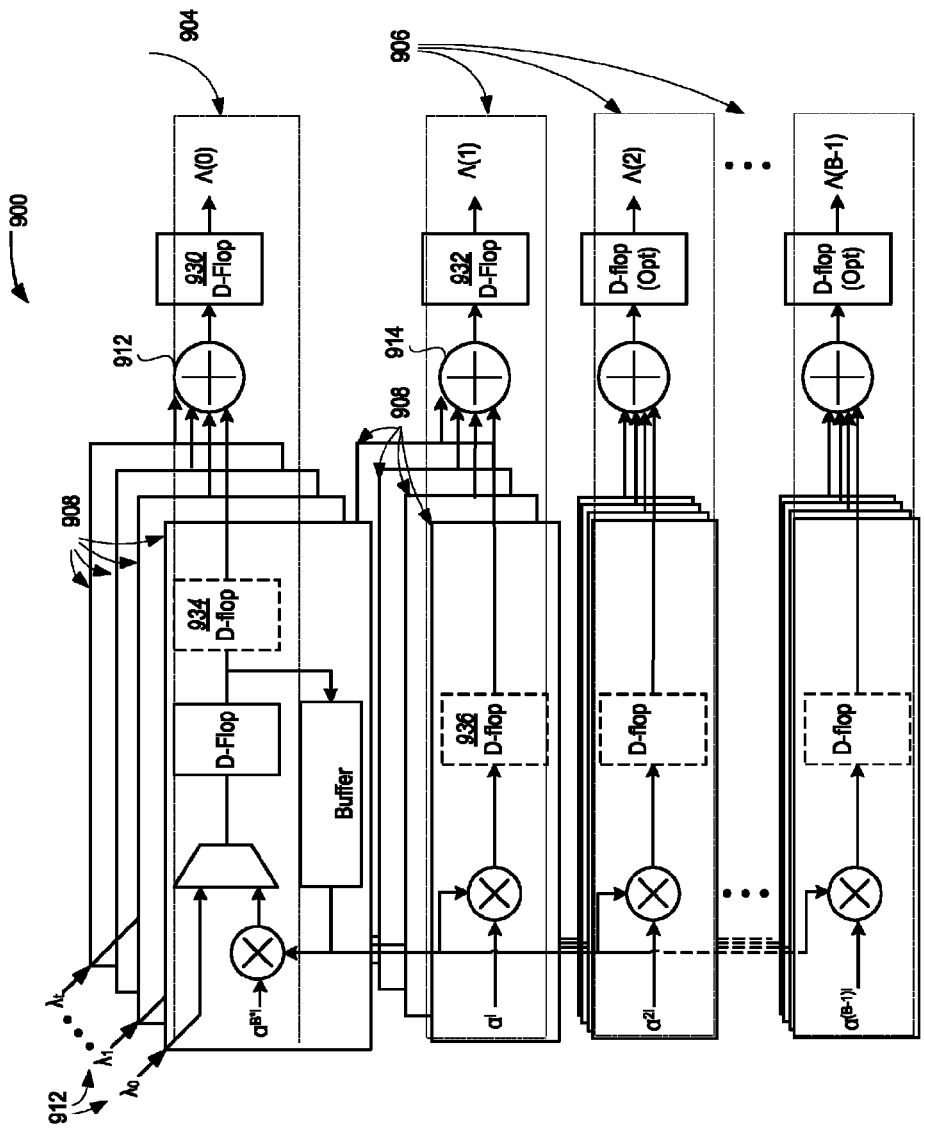
FIG. 9 shows the Chien circuit of FIG. 8 configured to evaluate M roots in parallel.

For example, FIG. 9 shows the Chien circuit of FIG. 8 configured to evaluate B roots in parallel. Chien search circuit 900 is configured to process each possible root of a subset of B possible roots in parallel for each polynomial coefficient. In this example, Chien circuit 900 includes one evaluation circuit 904 of a first type and B-1 evaluation circuits 906 of a second type, which are implemented in a similar manner as evaluation circuits 804 and 806 as described with reference to FIG. 8. Each of the B evaluation circuits 904 and 906 is configured to sequentially evaluate a subset of the plurality of possible roots $\alpha^i$ as described with reference to FIG. 8.

Similar to Chien circuit 800, each of the evaluation circuits 904 and 906 includes a respective plurality of sub-circuits 908. For each of the evaluation circuits, the corresponding plurality of sub-circuits includes a respective sub-circuit for inputting each of a plurality of coefficients $\lambda_i$ 912 ($0 \leq i \leq T$) of the error location polynomial $\Lambda(x)$ having T+1 coefficients. Each sub-circuit is configured and arranged to calculate one term of the error location polynomial for the corresponding root $\alpha^{x*i}$ evaluated by the respective evaluation circuit 904 and 906. Each evaluation circuit includes, a respective summation circuit 912/914 configured to sum terms generated by the corresponding sub-circuits to produce an error location polynomial that is evaluated for the corresponding root as described with reference to FIG. 8.

In this example, each of the evaluation circuits includes a respective buffer 930/932 for storing output from the respective summation circuit 912/914. In some alternative embodiments, each sub-circuit of evaluation circuits 904 and 906 may optionally include D-flops 934/936 before summation circuits 912/914 to improve timing and synchronization of the sub-circuits.

Figure 10:
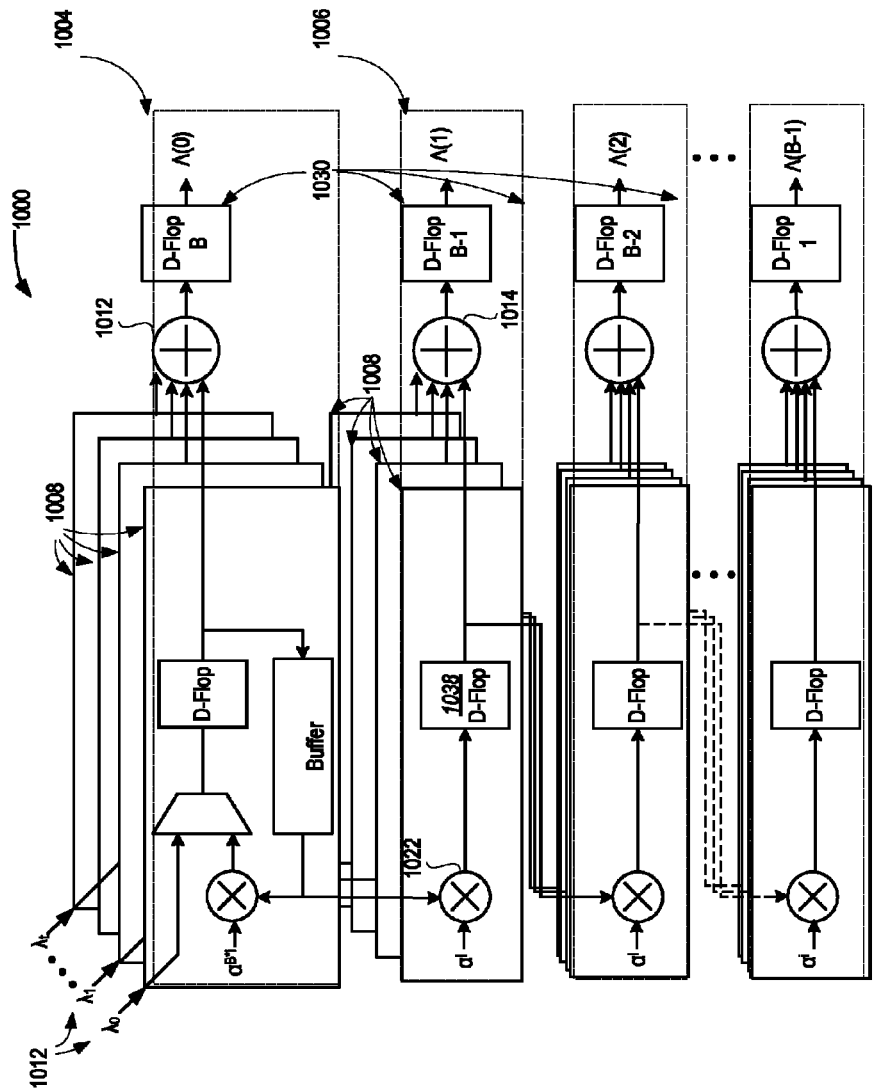
FIG. 10 shows another Chien search circuit configured to evaluate M possible roots in parallel.

FIG. 10 shows another Chien search circuit configured to evaluate B possible roots in parallel. The Chien search circuit 1000 may, for example, be used to implement Chien search circuit 706 shown in FIG. 7. Similar to Chien circuit 800 shown in FIG. 8, Chien search circuit 1000 includes a plurality of evaluation circuits including one evaluation circuit 1004 of a first type and B-1 evaluation circuits of a second type 1006. Likewise, each evaluation circuit 1004 and 1006 includes a respective plurality of sub-circuits 1008, one sub-circuit for each of a plurality of coefficients $\lambda_i$ 1012 ($0 \leq i \leq T$) of the error location polynomial $\Lambda(x)$ having T+1 coefficients. The sub-circuits are configured to each calculate respective terms of the error location polynomial which are summed by a summation circuit 1012/1014 of the evaluation circuit as described above.

The evaluation circuit 1004 of the first type is implemented and operates in a similar manner to evaluation circuit 804 described with reference to FIG. 8. In this embodiment, each evaluation circuit 1006$_C$ of the second type is configured to multiply the error location polynomial, evaluated for a possible root $a^{(C-1)*i}$ input to the evaluation circuit, by a constant $a^i$, using multiplier 1022, to evaluate the polynomial for the possible root $a^{C*i}$. The result is stored in register 1038 of the evaluation circuit 1006$_C$, and the result is input to the next evaluation circuit 1006$_{C+1}$.

It is recognized that delay will be incurred as results are propagated from each evaluation circuit 1006$_C$ to the next evaluation circuit 1006$_{C+1}$. Buffers 1030 may be sized appropriately to synchronize outputs of the evaluation circuits 1004 and 1006 such that evaluated polynomials output from summation circuits 1012 and 1014 in a given cycle correspond to the same error location polynomial. In this example, buffer 1030 of evaluation circuit 1004 is configured to buffer B-1 values. For each evaluation circuit 1006$_C$ of the second type following evaluation circuit 1004, a respective buffer 1030 is configured to buffer (B-C-1) values.

Figure 11:
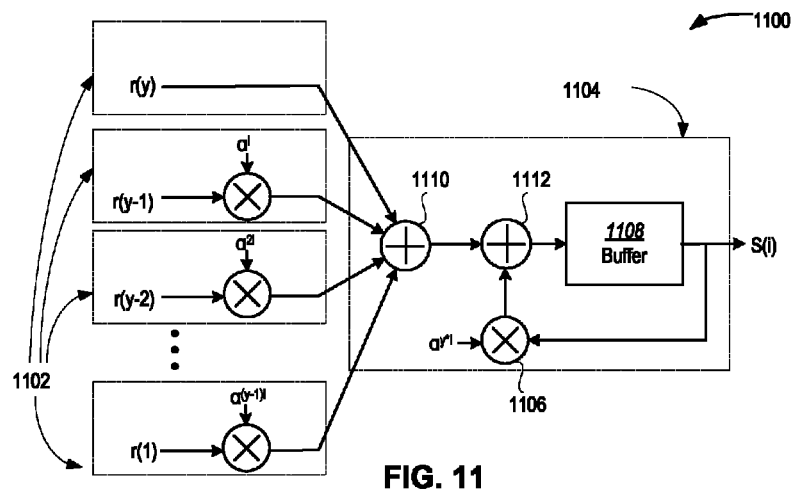
FIG. 11 shows a syndrome polynomial generator circuit configured to generate a syndrome polynomial in parallel in accordance with one or more embodiments.

FIG. 11 shows a syndrome polynomial generation circuit configured to generate a syndrome polynomial in parallel in accordance with one or more embodiments. The syndrome polynomial generation 1100 may be used to implement the syndrome calculation circuit 702 shown in FIG. 7, for example. The syndrome polynomial generation circuit 1100 includes a plurality of polynomial term generator circuits 1102 including Y polynomial term generator circuits. Each polynomial term generator circuit 1102$_Z$ is configured to evaluate a received polynomial R(x) with a respective root $\alpha^{Z*i}$ (for $0 \leq Z < Y$) of a generator polynomial to generate the respective term of the syndrome polynomial. Each polynomial term generator circuit 1102 generates one term of 2t terms of the syndrome polynomial each cycle, t being equal to the number of bits or words that may be corrected by the syndrome polynomial.

A polynomial constructor circuit 1104 is configured to generate a syndrome polynomial S(i) each cycle D. The polynomial constructor circuit 1104 multiplies a syndrome polynomial S(i-1), as generated in the previous cycle D-1 and stored in buffer 1108, by $\alpha^{Y*i}$ using multiplier 1106 to produce an intermediate value. The polynomial constructor circuit 1104 sums the intermediate value with the terms generated by the plurality of polynomial term generator circuits using summation circuits 1110 and 1112.

Figure 12:
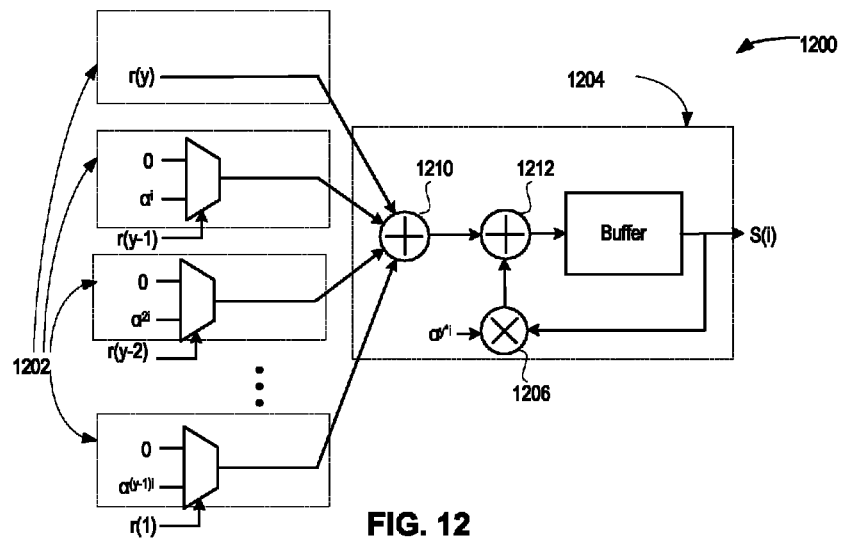
FIG. 12 shows a syndrome polynomial generator circuit optimized to generate a syndrome polynomial from a received polynomial r(x) that is coded in a binary polynomial format.

FIG. 12 shows a syndrome polynomial generation circuit optimized to generate a syndrome polynomial from a received polynomial R(x) that is coded in a binary polynomial format. The syndrome polynomial generation 1200 may be used to implement syndrome calculation circuit 702 shown in FIG. 7, for example.

Similar to the syndrome polynomial generation circuit shown in FIG. 11, the syndrome polynomial generation circuit includes Y polynomial term generator circuits 1202. Each polynomial term generator circuit 1202$_Z$ is configured to evaluate a received polynomial R(Y-Z) with a respective root $\alpha^{Z*i}$ of a generator polynomial to generate the respective term of the syndrome polynomial. Because the received polynomial R(x) is a binary coded term, the polynomial term generated by each polynomial term generator circuit 1202$_Z$ is either 0 or $\alpha^{Z*i}$. In this embodiment, each polynomial term generator circuit 1202$_Z$ includes a multiplexor configured to output either 0 or $\alpha^{Z*i}$ according to a polynomial R(Y-Z) that drives a selection input of the multiplexor.

Similar to the syndrome polynomial generation circuit shown in FIG. 11, syndrome polynomial generation circuit 1200 includes a polynomial constructor circuit 1204 configured to generate a syndrome polynomial S(i) each cycle D. The polynomial constructor circuit 1204 multiplies a syndrome polynomial S(i-1) as generated in the previous cycle D-1 and stored in buffer 1208, by $\alpha^{Y*i}$ using multiplier 1206 to produce an intermediate value. The polynomial constructor circuit 1204 sums the intermediate value with the terms generated by the plurality of polynomial term generator circuits using summation circuits 1210 and 1212.

Figure 13:
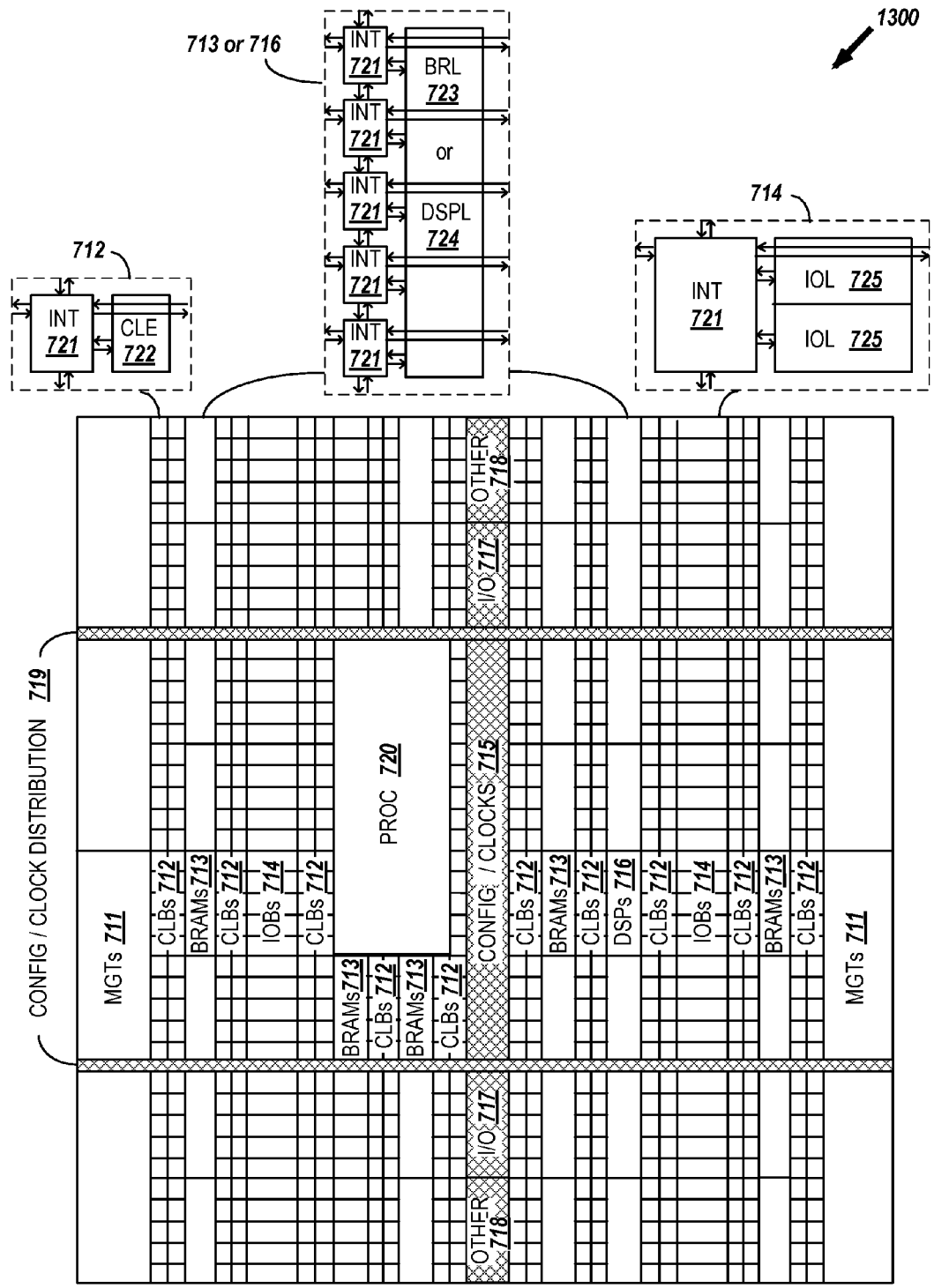
FIG. 13 shows a block diagram of an example programmable integrated circuit that may be used in implementing a decoder for forward error correction in accordance with one or more embodiments.

FIG. 13 is a block diagram of an example programmable logic integrated circuit that may be used in implementing a decoder for forward error correction in accordance with one or more embodiments. A decoder for forward error correction, as previously described, may be implemented on the programmable logic and interconnect resources of a programmable integrated circuit.

FPGAs can include several different types of programmable logic blocks in the array. For example, FIG. 13 illustrates an FPGA architecture (1300) that includes a large number of different programmable tiles including multi-gigabit transceivers (MGTs 711), configurable logic blocks (CLBs 712), random access memory blocks (BRAMs 713), input/output blocks (IOBs 714), configuration and clocking logic (CONFIG/CLOCKS 715), digital signal processing blocks (DSPs 716), specialized input/output blocks (I/O 717), for example, e.g., clock ports, and other programmable logic 718 such as digital clock managers, analog-to-digital converters, system monitoring logic, and so forth. Some FPGAs also include dedicated processor blocks (PROC 720) and internal and external reconfiguration ports (not shown).

In some FPGAs, each programmable tile includes a programmable interconnect element (INT 721) having standardized connections to and from a corresponding interconnect element in each adjacent tile. Therefore, the programmable interconnect elements taken together implement the programmable interconnect structure for the illustrated FPGA. The programmable interconnect element INT 721 also includes the connections to and from the programmable logic element within the same tile, as shown by the examples included at the top of FIG. 13.

For example, a CLB 712 can include a configurable logic element CLE 722 that can be programmed to implement user logic plus a single programmable interconnect element INT 721. A BRAM 713 can include a BRAM logic element (BRL 723) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 716 can include a DSP logic element (DSPL 724) in addition to an appropriate number of programmable interconnect elements. An IOB 714 can include, for example, two instances of an input/output logic element (IOL 725) in addition to one instance of the programmable interconnect element INT 721. As will be clear to those of skill in the art, the actual I/O pads connected, for example, to the I/O logic element 725 are manufactured using metal layered above the various illustrated logic blocks, and typically are not confined to the area of the input/output logic element 725.

In the pictured embodiment, a columnar area near the center of the die (shown shaded in FIG. 13) is used for configuration, clock, and other control logic. Horizontal areas 719 extending from this column are used to distribute the clocks and configuration signals across the breadth of the FPGA.

Some FPGAs utilizing the architecture illustrated in FIG. 13 include additional logic blocks that disrupt the regular columnar structure making up a large part of the FPGA. The additional logic blocks can be programmable blocks and/or dedicated logic. For example, the processor block PROC 720 shown in FIG. 13 spans several columns of CLBs and BRAMs.

Note that FIG. 13 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 13 are purely exemplary. For example, in an actual FPGA more than one adjacent column of CLBs is typically included wherever the CLBs appear, to facilitate the efficient implementation of user logic.

The embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A block code decoder, comprising:
a first decoder configured and arranged to decode Bose-Chaudhuri-Hochquenghem (BCH) coded data packets, the first decoder including:
a first memory buffer configured and arranged to receive BCH encoded data;
one or more BCH decoder circuits coupled to the first memory buffer and each BCH decoder circuit configured and arranged to decode in parallel a plurality of BCH encoded bits included in the BCH encoded data; and
a second memory buffer coupled to the one or more BCH decoder circuits for storage of decoded BCH data, the decoded BCH data including Reed-Solomon (RS) encoded data; and
a second decoder, including:
a third memory buffer coupled to the second memory buffer and configured and arranged to receive the decoded BCH data from the first decoder;
one or more RS decoder circuits coupled to the third memory buffer, each RS decoder circuit configured and arranged to decode in parallel a plurality of RS encoded bits included in the decoded BCH data; and
a fourth memory buffer coupled to the one or more RS decoder circuits for storage of RS-decoded data.

2. The decoder of claim 1, wherein:
the decoded BCH data further includes BCH parity data;
the second decoder includes an input selection circuit configured to:
receive and pass the RS encoded data, included in the decoded BCH data, to a first data path; and
receive and pass the BCH parity data to a second data path;
the first data path includes the third memory buffer, the one or more RS decoder circuits and the fourth memory buffer; and
the second data path includes a fifth memory buffer coupled to the second memory buffer.

3. The decoder of claim 1, wherein each of the BCH encoded data packets includes an interleaved plurality of separately encoded BCH data groups.

4. The decoder of claim 3, wherein:
the first memory buffer includes a first memory and a control circuit, and the control circuit is configured and arranged to:
receive a first block of the BCH encoded data, each bit of the first block corresponding to a respective one of the BCH data groups;
rotate bits of the first block of data by p bits, where 0<=p<=a number of the BCH data groups; and
store the rotated bits of the first block of data in a row p of the first memory buffer.

5. The decoder of claim 4, wherein each bit stored in a row of the first memory buffer corresponds to a different data group of the plurality of separately encoded BCH data groups, and each bit stored in a column of the first memory buffer corresponds to one of the plurality of separately encoded BCH data groups.

6. The decoder of claim 3, wherein:
the plurality of separately encoded BCH data groups includes 64 separately encoded BCH data groups; and
the first memory buffer includes a first memory, a second memory, and a control circuit, and the control circuit is configured and arranged to:
receive a plurality of 32-bit blocks of the BCH encoded data packet, each odd numbered 32-bit block having 32 bits that correspond to a respective first 32 groups of the 64 BCH data groups, each even numbered 32-bit block having 32 bits that correspond to a respective second 32 groups of the 64 BCH data groups;
for each odd numbered 32-bit block p (0<=p<32):
rotate bits of the odd numbered 32-bit block p by p bits; and
store the rotated bits of the odd numbered block of data in row p of the first memory; and
for each even numbered 32-bit block q (0<=q<32):
rotate bits of the even numbered 32-bit block q by q bits; and
store the rotated bits of the even numbered block of data in row q of the second memory.

7. The decoder of claim 6, wherein bits stored in different rows and columns of the first memory and of the second memory are accessible in parallel.

8. The decoder of claim 7, wherein the control circuit is configured and arranged to:
perform the receiving, the rotating, and the storing of 32-bit data blocks while operating in a first mode, and the control circuit is further configured to operate in the first mode in response to either the first or second memories of the first memory buffer having a row available for storage of a 32-bit block; and
operate in a second mode in response to the storing 32-bit blocks in all the rows of the first and second memories, and the control circuit being further configured to read from the first and second memories, groups of bits belonging to the same BCH data group.

9. The decoder of claim 3, wherein
the one or more BCH decoder circuits includes K BCH decoder circuits;

each of the K BCH decoder circuits is configured and arranged to decode in parallel M bits belonging to the same BCH data group; and the first decoder is configured to receive the BCH coded data packets on a K*M bit bus.

10. The decoder of claim 9, wherein each of the K BCH decoder circuits is configured to decode a plurality of M-bit blocks of data corresponding to (64/M) of the separately encoded BCH data groups, in a time division multiplexed manner.

11. The decoder of claim 9, wherein the first and second memory buffers are each arranged in a (2M/K) bit wide and (K*M) bit deep configuration.

12. The decoder of claim 9, wherein the first and second memory buffers are each configured to implement double buffering and are arranged in a (2M/K) bit wide and (K*M) bit deep configuration.

13. The decoder of claim 1, wherein the one or more RS decoder circuits includes L RS decoder circuits, each RS decoder circuit being configured and arranged to decode N bits in parallel, and K*M being less than or equal to L*N.

14. The decoder of claim 13, wherein M is not equal to N.

15. The decoder of claim 13, wherein the third and fourth memory buffers are each arranged in to store L*N bits.

16. A method of decoding for forward error correction, comprising:
receiving Bose-Chaudhuri-Hochquenghem (BCH) encoded data including an interleaved plurality of separately encoded BCH data groups;
rearranging and storing the BCH encoded data in a first memory buffer such that a plurality of bits of each BCH data group are readable from the first memory buffer in parallel;
reading bits of each BCH data group in parallel from the first memory buffer;
decoding the plurality of bits of each BCH data group in parallel using one or more BCH decoder circuits; and
writing the decoded plurality of bits of each BCH data group in parallel to a second memory buffer.

17. The method of claim 16, wherein:
the plurality of separately encoded BCH data groups includes 64 separately encoded BCH data groups;
the receiving of the BCH encoded data includes, receiving a plurality of 32-bit blocks of the BCH encoded data, each odd numbered 32-bit block having 32 bits corresponding to a respective first 32 of the 64 BCH data groups, each even numbered 32-bit block having 32 bits corresponding to a respective second 32 of the 64 BCH data groups; and
the rearranging and storing of the BCH encoded data includes:
for each odd numbered 32-bit block p (0<=p<32):
rotating bits of the odd numbered 32-bit block by p bits; and
storing the rotated bits of the odd numbered block of data in row p of a first memory of the first memory buffer; and
for each even numbered 32-bit block q (0<=q<32):
rotating bits of the even numbered 32-bit block q by q bits; and
storing the rotated bits of the even numbered block of data in row q of a second memory of the first memory buffer.

18. The method of claim 17, wherein the decoding is performed in response to storing the BCH encoded data in each row of the first and second memories of the first memory buffer.

19. The method of claim 16, wherein:
the receiving of the BCH encoded data is on an K*M bit bus;
the one or more BCH decoder circuits includes K BCH decoder circuits; and
the decoding of the plurality of bits of each BCH data group in parallel includes each of the K BCH decoder circuits decoding M bits belonging to the same respective BCH data group in parallel.

20. The method of claim 19, wherein the decoding of the plurality of bits of each BCH data group in parallel includes each of the K BCH decoder circuits decoding a plurality of M-bit blocks of data corresponding to a respective subset of (64/M) of the separately encoded BCH data groups, in a time division multiplexed manner.

* * * * *